(12) United States Patent
Park et al.

(10) Patent No.: US 10,600,859 B2
(45) Date of Patent: Mar. 24, 2020

(54) DISPLAY DEVICE

(71) Applicant: Samsung Display Co., Ltd., Yongin-si, Gyeonggi-Do (KR)

(72) Inventors: Hyunae Park, Yongin-si (KR); Jieun Lee, Yongin-si (KR); Yunkyeong In, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/241,757

(22) Filed: Jan. 7, 2019

(65) Prior Publication Data

US 2019/0305072 A1 Oct. 3, 2019

(30) Foreign Application Priority Data

Apr. 3, 2018 (KR) ........................ 10-2018-0038739

(51) Int. Cl.
| | |
|---|---|
| *H01L 51/00* | (2006.01) |
| *H01L 27/32* | (2006.01) |
| *H01L 51/52* | (2006.01) |
| *G09G 3/3225* | (2016.01) |

(52) U.S. Cl.
CPC ....... *H01L 27/3279* (2013.01); *G09G 3/3225* (2013.01); *H01L 27/3246* (2013.01); *H01L 27/3258* (2013.01); *H01L 51/5206* (2013.01); *H01L 51/5221* (2013.01); *H01L 51/5246* (2013.01); *H01L 51/5281* (2013.01); *G09G 2310/0278* (2013.01); *H01L 27/3276* (2013.01); *H01L 27/3288* (2013.01); *H01L 27/3297* (2013.01); *H01L 51/0097* (2013.01)

(58) Field of Classification Search
CPC ............. H01L 27/3276; H01L 27/3288; H01L 27/3258; H01L 27/3297
See application file for complete search history.

(56) References Cited

U.S. PATENT DOCUMENTS

| | | | |
|---|---|---|---|
| 6,310,370 B1 * | 10/2001 | Inoue | ............... H01L 27/14812 257/241 |
| 8,829,495 B2 | 9/2014 | Kim et al. | |
| 8,982,306 B2 * | 3/2015 | Yamaguchi | ......... H01L 51/5246 349/138 |

(Continued)

FOREIGN PATENT DOCUMENTS

| | | |
|---|---|---|
| KR | 10-2015-0016784 A | 2/2015 |
| KR | 10-2016-0000980 A | 1/2016 |

(Continued)

*Primary Examiner* — Nicholas J Tobergte
(74) *Attorney, Agent, or Firm* — Innovation Counsel LLP

(57) ABSTRACT

A display device includes a substrate, a plurality of pixels, a plurality of wirings, a power voltage supply line, an insulating layer, and a window. The substrate includes a display area and a peripheral area outside the display area. The plurality of pixels are in the display area and the plurality of wirings are in the peripheral area. The power voltage supply line covers the plurality of wirings and includes a top surface having an irregular surface corresponding to the plurality of wirings. The insulating layer includes an opening overlapping a first portion of the power voltage supply line. The window is disposed on the insulating layer and includes a light-blocking region and a light-transmissive region, the light-transmissive region entirely covering the opening.

28 Claims, 12 Drawing Sheets

(56) References Cited

U.S. PATENT DOCUMENTS

| | | | |
|---|---|---|---|
| 9,425,434 B2 | 8/2016 | Lee et al. | |
| 10,109,692 B2 | 10/2018 | Senda et al. | |
| 10,312,305 B2* | 6/2019 | Kim | H01L 27/3262 |
| 2006/0226423 A1* | 10/2006 | Yamasaki | G02F 1/13454 |
| | | | 257/59 |
| 2009/0065780 A1* | 3/2009 | Yasukawa | H01L 29/42384 |
| | | | 257/71 |
| 2011/0090436 A1* | 4/2011 | Choi | G02F 1/136286 |
| | | | 349/106 |
| 2012/0154734 A1* | 6/2012 | Kaneko | G02F 1/13452 |
| | | | 349/158 |
| 2016/0276422 A1 | 9/2016 | Kim | |
| 2017/0345881 A1 | 11/2017 | Kim et al. | |
| 2017/0347474 A1 | 11/2017 | Alonso et al. | |
| 2018/0159077 A1* | 6/2018 | Lee | H01L 51/5246 |
| 2019/0267444 A1* | 8/2019 | Moon | H01L 51/0097 |

FOREIGN PATENT DOCUMENTS

| | | |
|---|---|---|
| KR | 10-1701978 B1 | 2/2017 |
| KR | 10-2017-0113932 A | 10/2017 |
| KR | 10-2017-0134828 A | 12/2017 |

* cited by examiner

DISPLAY DEVICE

CROSS-REFERENCE TO RELATED APPLICATION

This application claims the benefit of Korean Patent Application No. 10-2018-0038739, filed on Apr. 3, 2018, in the Korean Intellectual Property Office, the disclosure of which is incorporated herein in its entirety by reference.

BACKGROUND

1. Field

One or more embodiments relate to a display device.

2. Description of the Related Art

A display device includes a display area providing an image. The display area includes a plurality of pixels. A driving circuit unit may be provided outside the display area. Wirings for applying electric signals to the pixels and the driving circuit unit are arranged outside the display area.

SUMMARY

When external light is reflected by wirings outside a display area, a user recognizes the wirings.

One or more embodiments include a display device which prevents display quality from deteriorating due to external light. However, it should be understood that embodiments described herein should be considered in a descriptive sense only and not for limitation of the disclosure.

Additional aspects will be set forth in part in the description which follows and, in part, will be apparent from the description, or may be learned by practice of the presented embodiments.

According to one or more embodiments, a display device includes a substrate, a plurality of pixels, a plurality of wirings, a power voltage supply line, an insulating layer, and a window. The substrate includes a display area and a peripheral area outside the display area. The plurality of pixels are in the display area and the plurality of wirings are in the peripheral area. The power voltage supply line covers the plurality of wirings and includes a top surface having an irregular surface corresponding to the plurality of wirings. The insulating layer includes an opening overlapping a first portion of the power voltage supply line. The window is disposed on the insulating layer and includes a light-blocking region and a light-transmissive region, the light-blocking region entirely covering the opening.

Neighboring wirings among the plurality of wirings may be alternately arranged with an interlayer insulating layer therebetween.

The power voltage supply line may include a first edge adjacent to the display area, and a second edge opposite to the first edge, the first and second edges being covered by the insulating layer.

A width of the power voltage supply line may be greater than a width of the opening.

A first distance from the first edge to the opening may be greater than a second distance from the second edge to the opening.

The insulating layer may include an organic insulating material.

Each pixel of the plurality of pixels may include: a pixel electrode and an opposite electrode facing each other; and an emission layer between the pixel electrode and the opposite electrode.

The display device may further include a connection electrode layer connecting the power voltage supply line with the opposite electrode.

The connection electrode layer may be disposed on the insulating layer and may contact the power voltage supply line through the opening.

The connection electrode layer may include a hole.

The hole of the connection electrode layer may overlap the power voltage supply line with the insulating layer therebetween.

The display device may further include an insulating pattern layer covering the hole and exposing the connection electrode layer.

The insulating pattern layer may be an organic insulating layer.

An inner edge of the light-blocking region may be spaced apart from an edge of the display area.

According to one or more embodiments, a display device includes a substrate, a plurality of pixels, a first power voltage supply line, a second power voltage supply line, a planarization insulating layer, and a light-blocking pattern layer. The substrate includes a display area and a peripheral area outside the display area. The plurality of pixels are in the display area. The first power voltage supply line is in the peripheral area and adjacent to one side of the display area. The second power voltage supply line is disposed in the peripheral area and includes a first portion spaced apart from the one side of the display area, the first power voltage supply line being disposed between the one side of the display area and the first portion. The planarization insulating layer is disposed on the first power voltage supply line and the second power voltage supply line, and includes an opening overlapping the first portion of the second power voltage supply line. The light-blocking pattern layer is disposed on the planarization insulating layer and entirely covers the opening.

The display device may further include a plurality of wirings disposed between the substrate and the second power voltage supply line.

Neighboring wirings among the plurality of wirings may be alternately arranged with an interlayer insulating layer therebetween.

The second power voltage supply line may include a first edge adjacent to the one side of the display area and a second edge opposite to the first edge, and the opening may correspond to a region between the first edge and the second edge.

A width of the second power voltage supply line directed from the first edge to the second edge may be greater than a width of the opening.

A first distance from the first edge to the opening may be greater than a second distance from the second edge to the opening.

Each pixel of the plurality of pixels may include: a pixel electrode and an opposite electrode facing each other; and an emission layer between the pixel electrode and the opposite electrode.

The second power voltage supply line may be electrically connected to the opposite electrode.

The display device may further include a connection electrode layer disposed on the planarization insulating layer and connecting the opposite electrode with the second power voltage supply line.

The connection electrode layer may include a hole.

The hole may overlap the second power voltage supply line.

The display device may further include an insulating pattern layer covering the hole.

The insulating pattern layer may expose the connection electrode layer.

An inner edge of the light-blocking pattern layer may be spaced apart from the one side of the display area by a predetermined interval.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
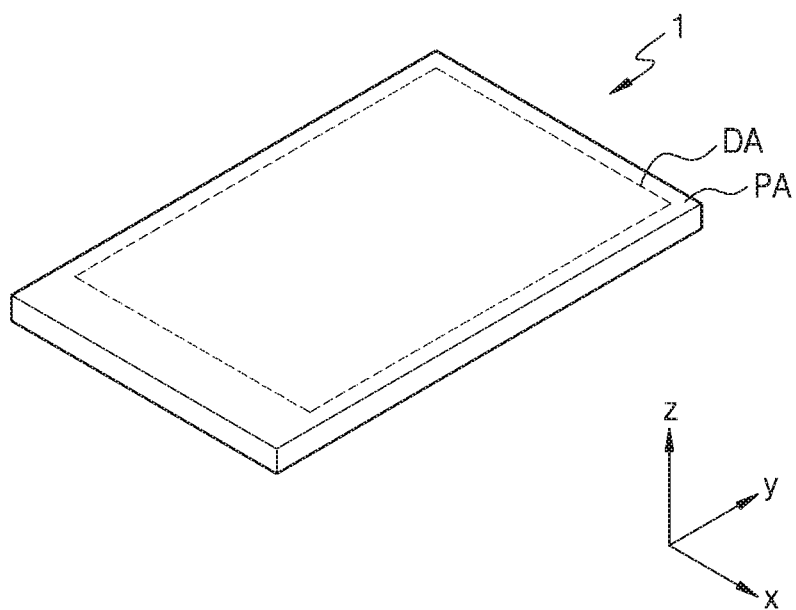
FIG. 1 is a perspective view of a display device according to an embodiment.

As the disclosure allows for various changes and numerous embodiments, example embodiments will be illustrated in the drawings and described in detail in the written description. An effect and a characteristic of the disclosure, and a method of accomplishing these will be apparent when referring to embodiments described with reference to the drawings. This disclosure may, however, be embodied in many different forms and should not be construed as limited to the example embodiments set forth herein.

Hereinafter, the disclosure will be described more fully with reference to the accompanying drawings, in which example embodiments of the disclosure are shown. When description is made with reference to the drawings, like reference numerals in the drawings denote like or corresponding elements, and repeated description thereof will be omitted.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises/includes" and/or "comprising/including" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Embodiments may prevent a wiring, etc. arranged outside a display area from being viewed due to external light. However, it should be understood that effects described herein should be considered in a descriptive sense only and not for limitation of the disclosure.

It will be understood that when a layer, region, or component is referred to as being "connected" to another layer, region, or component, it may be "directly connected" to the other layer, region, or component or may be "indirectly connected" to the other layer, region, or component with another layer, region, or component interposed therebetween. For example, it will be understood that when a layer, region, or component is referred to as being "connected to or electrically connected" to another layer, region, or component, it may be "directly electrically connected" to the other layer, region, or component or may be "indirectly connected or electrically connected" to the other layer, region, or component with another layer, region, or component interposed therebetween.

FIG. 1 is a perspective view of a display device 1 according to an embodiment.

Referring to FIG. 1, the display device 1 includes a display area DA and a peripheral area PA outside the display area DA. The display device 1 may provide an image through the display area DA. The display device 1 may be a liquid crystal display, an electrophoretic display, an organic light-emitting display, an inorganic light-emitting display, a quantum dot light-emitting display, a field emission display, a surface-conduction electron-emitter display, a plasma display, a cathode ray display, etc.

Though an organic light-emitting display is described as the display device 1 according to an embodiment, the display device 1 is not limited thereto and various types of display devices may be used.

FIGS. 2A, 2B, 2C, 2D, and 2E are cross-sectional views of the display device 1 according to embodiments.

Referring to FIGS. 2A to 2E, the display device 1 may include a display panel 10, an input sensing member 20, a reflection prevention member 30, and a window 40.

The display panel 10 produces an image. The display panel 10 may produce an image by using red, green, blue, and white light respectively emitted from organic light-emitting diodes (OLEDs).

Figure 2A:
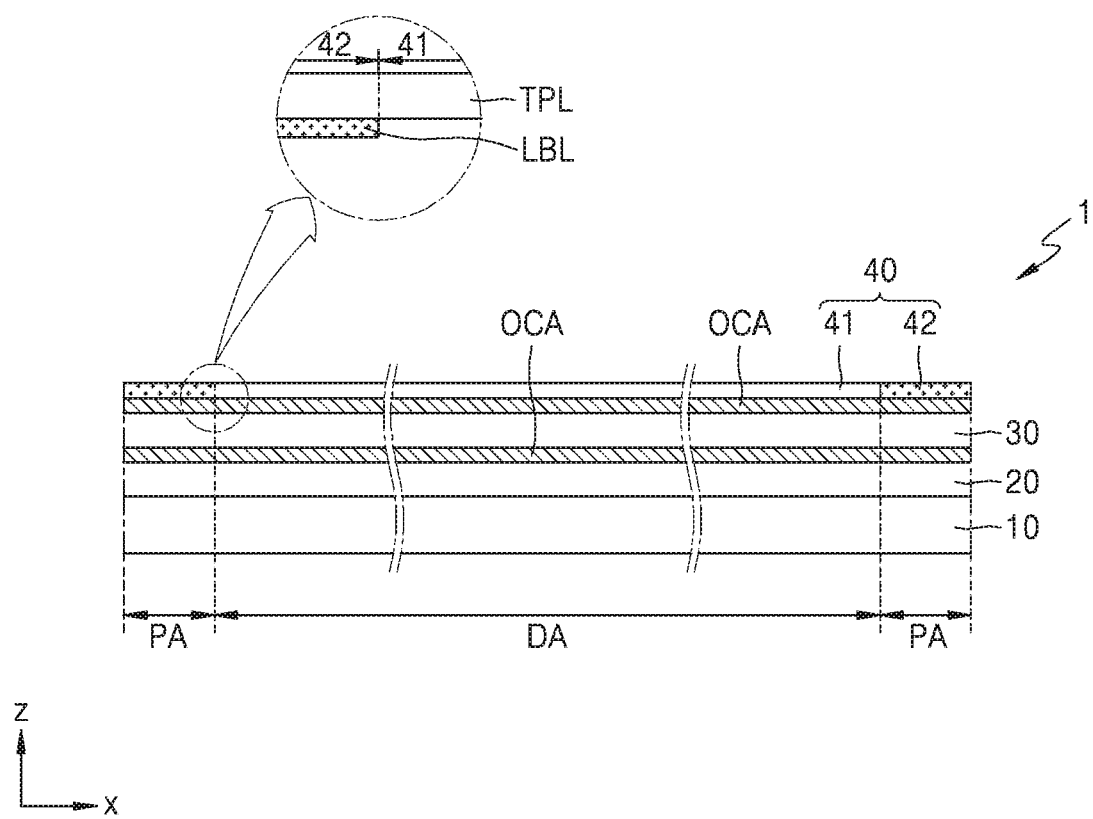
FIG. 2A is a cross-sectional view of a display device according to an embodiment.
Figure 2B:
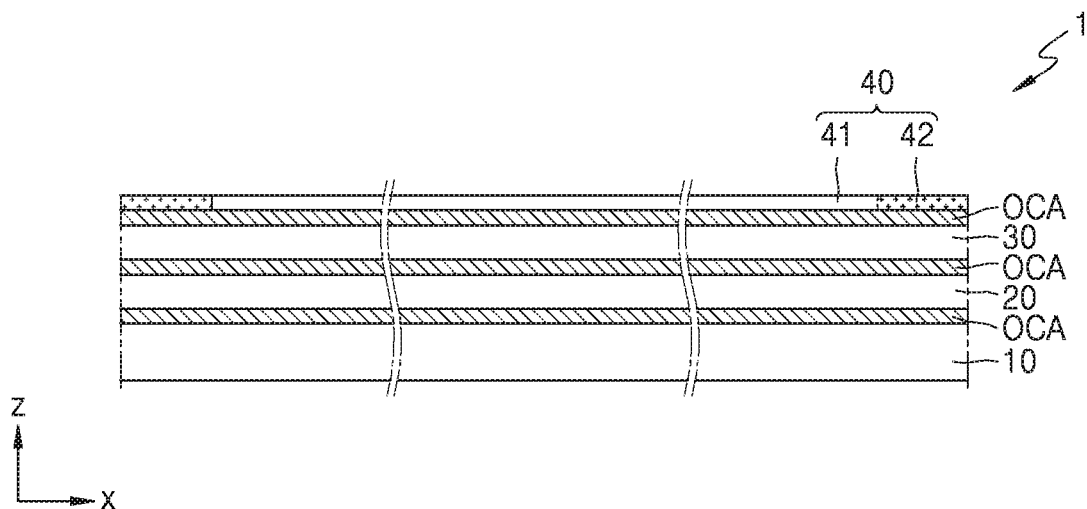
FIG. 2B is a cross-sectional view of a display device according to another embodiment.
Figure 2C:
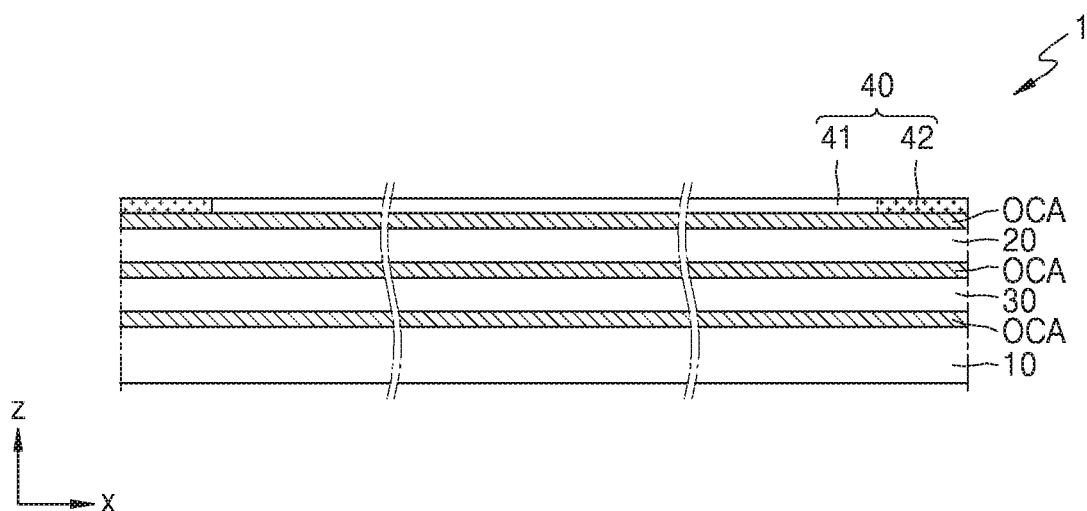
FIG. 2C is a cross-sectional view of a display device according to another embodiment.

The input sensing member 20 obtains coordinate information corresponding to an external input, for example, a touch event. The input sensing member 20 may include a sensing electrode (or a touch electrode) and trace lines connected to the sensing electrode. The input sensing member 20 may be disposed over the display panel 10 as illustrated in FIGS. 2A, 2B, 2D, and 2E, or may be disposed over the reflection prevention member 30 as illustrated in FIG. 2C.

Figure 2D:
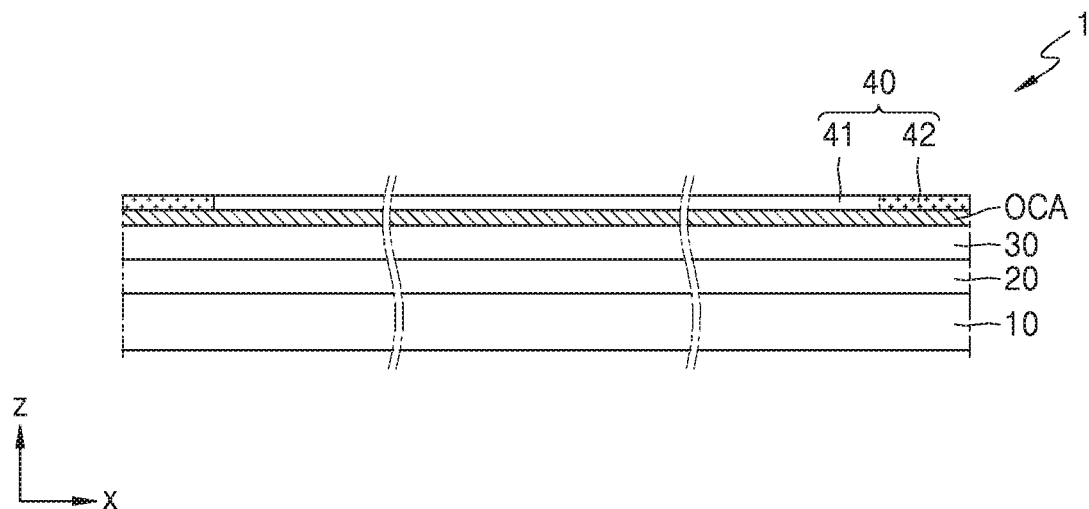
FIG. 2D is a cross-sectional view of a display device according to another embodiment.
Figure 2E:
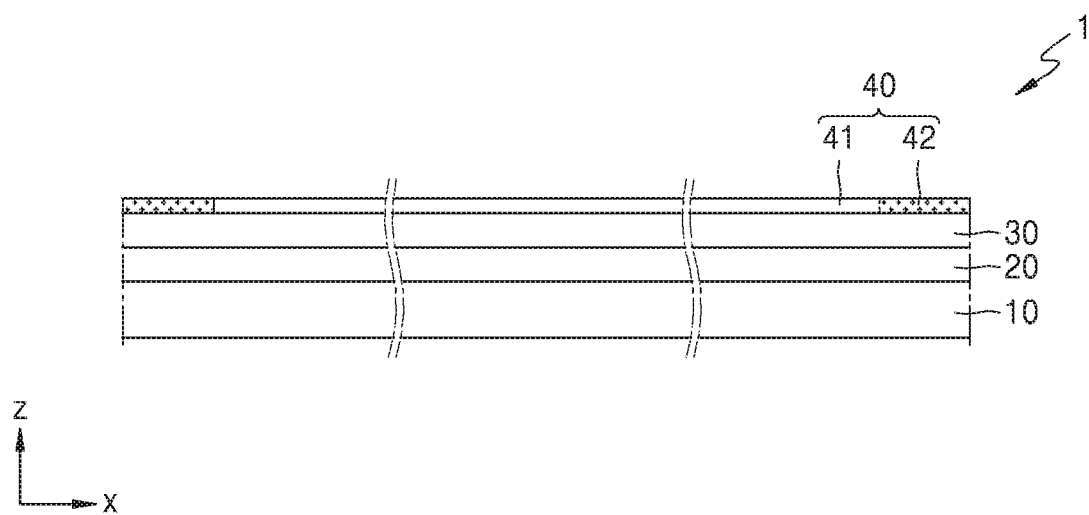
FIG. 2E is a cross-sectional view of a display device according to another embodiment.

A process of forming the input sensing member 20 may be successively performed after a process of forming the display panel 10. In this case, an adhesive member may not be disposed between the display panel 10 and the input sensing member 20 as illustrated in FIGS. 2A, 2D, and 2E. In another embodiment, the process of forming the input sensing member 20 may be performed separately from the process of forming the display panel 10. In this case, an adhesive member OCA may be interposed between the display panel 10 and the input sensing member 20 as illustrated in FIGS. 2B and 2C. FIGS. 2B and 2C illustrate an optically clear adhesive (OCA) as the adhesive member OCA.

The reflection prevention member 30 reduces reflectivity of light (external light) incident to the display panel 10 from the outside through the window 40. The reflection prevention member 30 may be disposed over the input sensing member 20 as illustrated in FIGS. 2A, 2B, 2D, and 2E, or may be disposed below the input sensing member 20 as illustrated in FIG. 2C.

In an embodiment, the reflection prevention member 30 may include a retarder and a polarizer. The retarder may be a film type or liquid crystal coating type retarder, and may include a λ/2 retarder and/or a λ/4 retarder. Also, the polarizer may be a film type or liquid crystal coating type polarizer. The film type polarizer may include a stretchable synthetic resin film, and the liquid crystal coating type polarizer may include liquid crystals disposed in a predetermined arrangement. The retarder and the polarizer may further include a protective film. The retarder or the polarizer itself, or the protective film may be defined as a base layer of the reflection prevention member 30.

In another embodiment, the reflection prevention member 30 may include a black matrix and color filters. The color filters may be disposed by taking into account colors of light emitted respectively from pixels of the display panel 10.

In another embodiment, the reflection prevention member 30 may include a destructive interference structure. The destructive interference structure may include a first reflection layer and a second reflection layer respectively disposed in different layers. First reflected light and second reflected light respectively reflected by the first reflection layer and the second reflection layer may destructively interfere, and thus reflectivity of external light may be reduced.

The window 40 may include a light transmissive region 41 corresponding to the display area DA, and a light-blocking region 42 corresponding to the peripheral area PA. As illustrated in an enlarged view of FIG. 2A, the window 40 may include a light transmissive base layer TPL and a light-blocking pattern layer LBL, the light-blocking region 42 may be defined by a portion of the light transmissive base layer TPL overlapping the light-blocking pattern layer LBL, and the light transmissive region 41 may be defined as a portion of the light transmissive base layer TPL not overlapping the light-blocking pattern layer LBL.

The light transmissive base layer TPL may include a glass substrate and/or a synthetic resin film, and may include a single layer or a multi-layer. For example, the light transmissive base layer TPL may include two or more films coupled by using an adhesive member. The light-blocking pattern layer LBL may include a colored organic layer.

As illustrated in FIGS. 2A, 2B, 2C, and 2D, the window 40 may be connected to elements therebelow by using an adhesive member OCA such as an optically clear adhesive. Alternatively, the window 40 may be directly formed on an element thereunder and thus connected to the element thereunder without an adhesive member. For example, in the embodiment of FIG. 2E, the window 40 is directly disposed on the reflection prevention member 30 thereunder. In another embodiment, in the case where the reflection prevention member 30 includes a black matrix and a color filter, a portion of the black matrix of the reflection prevention member 30 corresponding to the peripheral area PA may be the light-blocking pattern layer LBL described above with reference to FIG. 2A.

Though FIG. 2E illustrates that the window 40 is directly disposed on the reflection prevention member 30, the present disclosure is not limited thereto and is equally applicable to the embodiments described with reference to FIGS. 2A to 2D and/or all embodiments derived therefrom.

Figure 3:
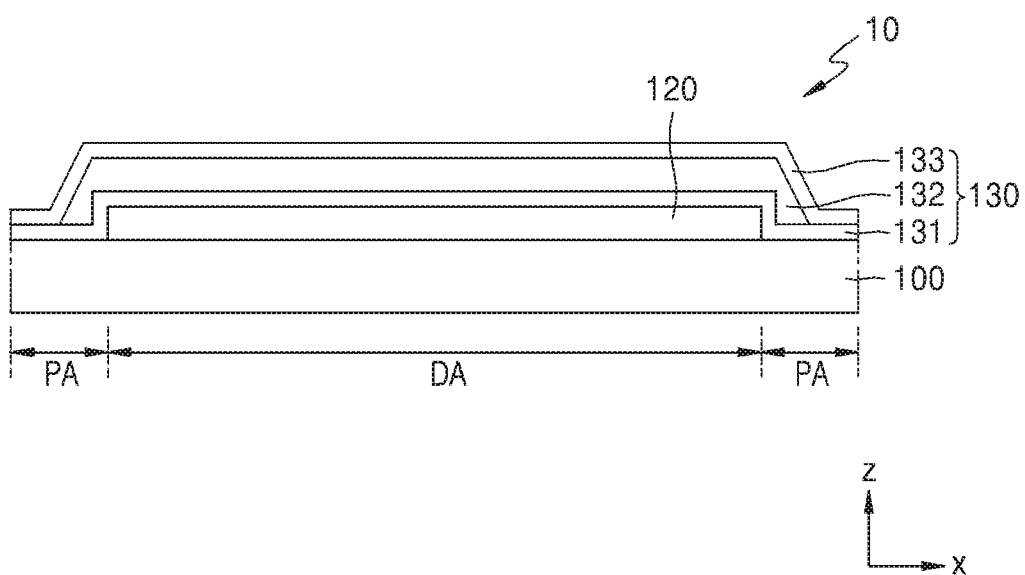
FIG. 3 is a cross-sectional view of a display panel according to an embodiment.

FIG. 3 is a cross-sectional view of a display panel according to an embodiment.

Referring to FIG. 3, the display panel 10 may include a display element layer 120 disposed on a substrate 100, and an encapsulation layer 130 covering the display element layer 120.

The substrate 100 may include polymer resins such as polyethersulphone (PES), polyacrylate (PAR), polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP). The substrate 100 may include a single-layered or multi-layered structure of the above materials. In the case where the substrate 100 includes a multi-layered structure, the substrate 100 may further include an inorganic layer (not shown). The substrate 100 may have a flexible, rollable, or bendable characteristic.

The display element layer 120 may include pixels, and each pixel may include an organic light-emitting diode and a pixel circuit electrically connected to the organic light-emitting diode. The pixel circuit may include a thin film transistor, a storage capacitor, a line connected thereto, etc, and include an insulating layer.

The encapsulation layer 130 protects the display element layer 120 from an external foreign substance such as moisture. The encapsulation layer 130 may include at least one inorganic encapsulation layer and at least one organic encapsulation layer. FIG. 3 illustrates that the encapsulation layer 130 includes first and second inorganic encapsulation layers 131 and 133, and an organic encapsulation layer 132 disposed therebetween.

Though the first and second inorganic encapsulation layers 131 and 133 may include silicon oxide, silicon nitride, silicon oxynitride, titanium oxide, and/or aluminum oxide, etc., the present disclosure is not limited thereto. Though the organic encapsulation layer 132 may include an acrylic-based organic material, the present disclosure is not limited thereto.

Figure 4:
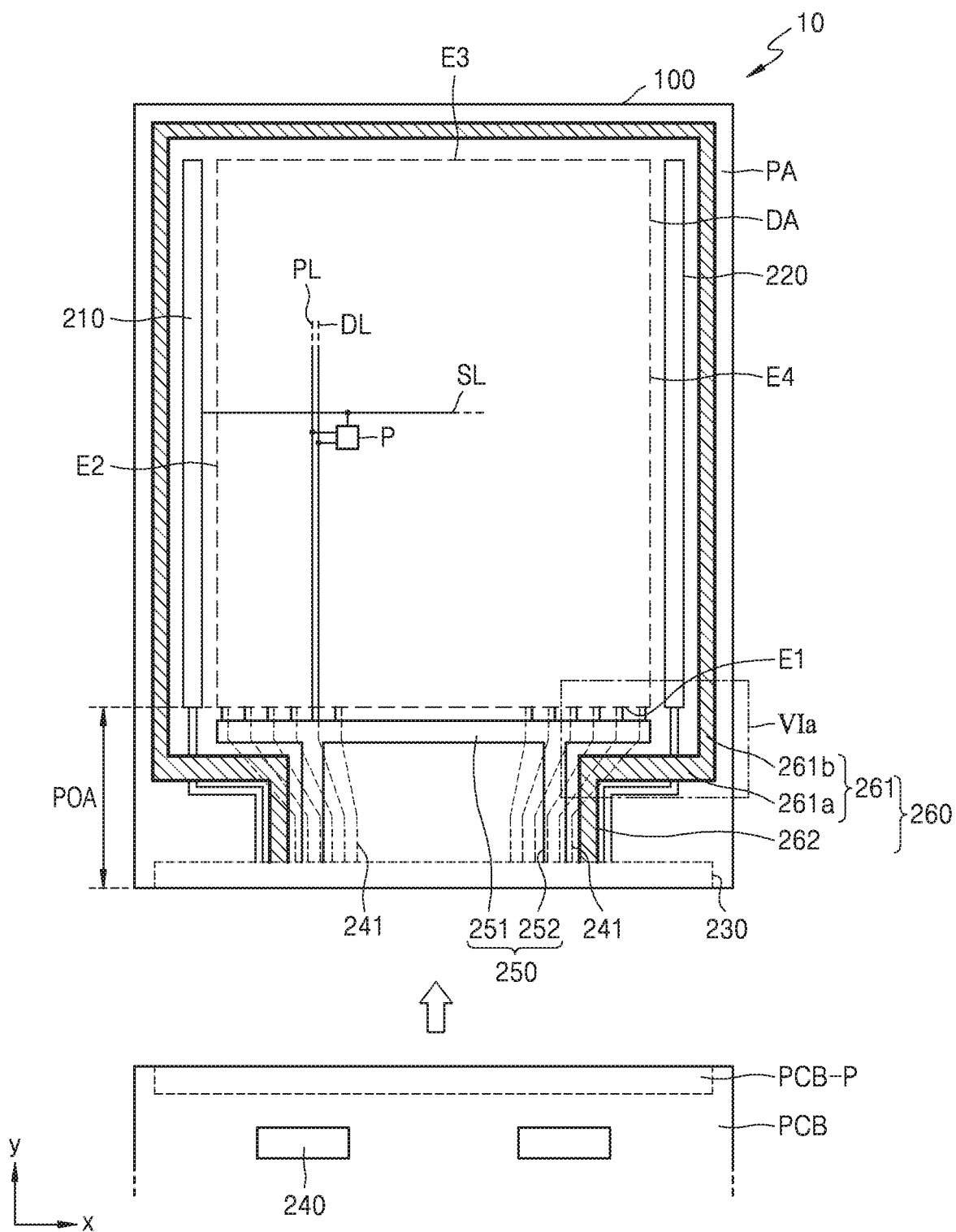
FIG. 4 is a plan view of a display panel according to an embodiment.
Figure 5A:
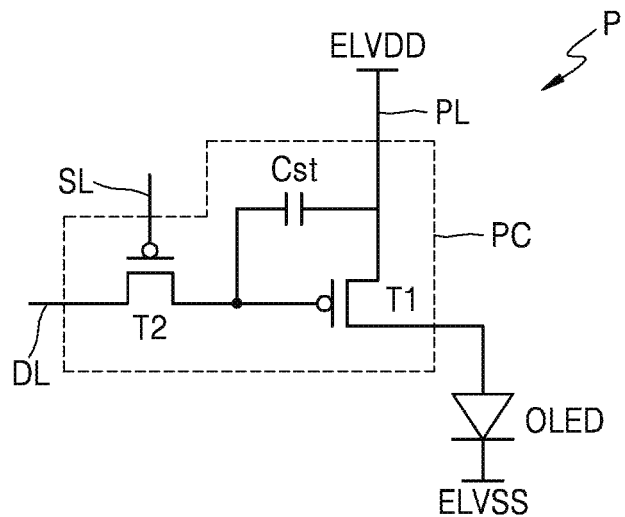
FIG. 5A is an equivalent circuit diagram of one pixel of a display panel according to an embodiment.
Figure 5B:
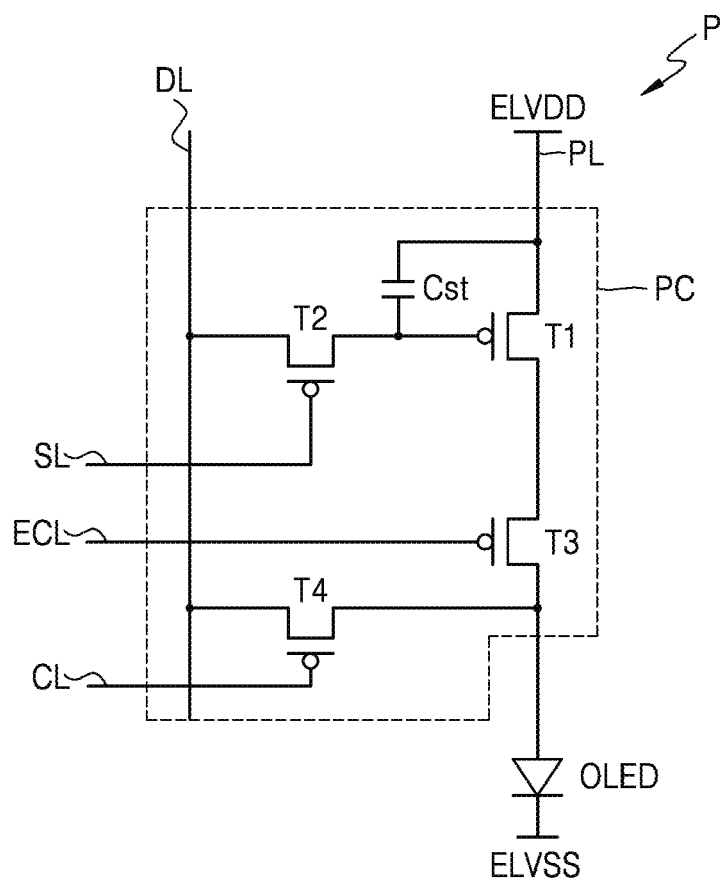
FIG. 5B is an equivalent circuit diagram of one pixel of a display panel according to another embodiment.

FIG. 4 is a plan view of a display panel according to an embodiment. FIG. 5A is an equivalent circuit diagram of one pixel of a display panel according to an embodiment. FIG. 5B is an equivalent circuit diagram of one pixel of a display panel according to another embodiment.

Referring to FIG. 4, the display panel 10 includes pixels P arranged in the display area DA. As illustrated in FIG. 5A, the pixel P may include a pixel circuit PC and an organic light-emitting diode OLED connected to the pixel circuit PC. A pixel electrode (e.g. an anode) of the organic light-emitting diode OLED is connected to the pixel circuit PC, and an opposite electrode (e.g. a cathode) of the organic light-emitting diode OLED is connected to a second power source ELVSS (also referred to as a second power voltage ELVSS). The organic light-emitting diode OLED emits light of a brightness based on a current supplied from the pixel circuit PC.

Referring to FIG. 5A, the pixel circuit PC may include a first thin film transistor T1, a second thin film transistor T2, and a storage capacitor Cst. The second thin film transistor T2 is a switching thin film transistor and is connected to a scan line SL and a data line DL, and transfers a data signal input through the data line DL to the first thin film transistor T1 in response to a scan signal input through the scan line SL.

The storage capacitor Cst is connected to the second thin film transistor T2 and a driving voltage line PL, and stores a voltage corresponding to a difference between a voltage transferred from the second thin film transistor T2 and a first power voltage ELVDD (or a driving voltage) supplied to the driving voltage line PL.

The first thin film transistor T1, which is a driving thin film transistor, is connected to the driving voltage line PL and the storage capacitor Cst and may control a driving current flowing through the organic light-emitting diode OLED from the driving voltage line PL in response to a voltage value stored in the storage capacitor Cst. The organic light-emitting diode OLED may emit light having a brightness by using the driving current.

Referring to FIG. 5B, the pixel circuit PC may further include third and fourth thin film transistors T3 and T4 in addition to the first and second thin film transistors T1 and T2.

A gate electrode of the third thin film transistor T3 is connected to an emission control line ECL. A first electrode of the third thin film transistor T3 is connected to a second electrode of the first thin film transistor T1, and a second electrode of the third thin film transistor T3 is connected to the organic light-emitting diode OLED. The third thin film transistor T3 is turned off when an emission control signal is supplied to the emission control line ECL and turned on when the emission control signal is not supplied to the emission control line ECL. Here, the emission control signal may be supplied while a voltage corresponding to a data signal is charged in the storage capacitor Cst, and while deterioration information of the organic light-emitting diode OLED is sensed.

The fourth thin film transistor T4, which is a sensing transistor, may be turned on during a current sensing operation period of the organic light-emitting diode OLED. A gate electrode of the fourth thin film transistor T4 may be connected to a control line CL. A first electrode of the fourth thin film transistor T4 is connected to the second electrode of the third thin film transistor T3. Also, a second electrode of the fourth thin film transistor T4 is connected to the data line DL. The fourth thin film transistor T4 may be turned on when a control signal is supplied to the control line CL and turned off otherwise. The control signal may be supplied while deterioration information of the organic light-emitting diode OLED is sensed.

Though FIGS. 5A and 5B describe a case where a pixel P includes two or four thin film transistors and one storage capacitor, the present disclosure is not limited thereto. In another embodiment, the pixel circuit PC may include three or more thin film transistors, or include two or more storage capacitors. Various modifications may be made.

Referring to FIG. 4 again, the peripheral area PA is a non-display area which does not provide an image and may surround the display area DA. First and second outer circuits 210 and 220, a pad unit 230, and a first power voltage supply line 250 and a second power voltage supply line 260 may be disposed in the peripheral area PA.

The first outer circuit 210 may be disposed in parallel to a second lateral side E2 of the display area DA. The first outer circuit 210 may be a scan driving circuit. The first outer circuit 210 may supply a scan signal to the scan line SL electrically connected thereto. The second outer circuit 220 may be disposed in parallel to a fourth lateral side E4 of the display area DA. The first and second outer circuits 210 and 220 may extend in parallel with the display area DA therebetween. The second outer circuit 220 may be another scan driving circuit or a control driving circuit configured to supply an emission control signal.

The pad unit 230 may be disposed in a portion of the peripheral area PA in which the first and second outer circuits 210 and 220 are not disposed. For example, the pad unit 230 may be disposed in one end of a substrate 100 adjacent to a first lateral side E1 of the display area DA. The pad unit 230 may be electrically connected to a circuit board PCB. The circuit board PCB may include a pad region PCB-P for connecting to the pad unit 230. The circuit board PCB may be a rigid circuit board or a flexible circuit board. The circuit board PCB may be directly connected to the substrate 100, or connected to the substrate 100 through another circuit board.

A data driving circuit 240 may be disposed in the circuit board PCB. The data driving circuit 240 may be electrically connected to the data line DL passing over the display area DA through wirings 241 connected to the pad unit 230 and may provide a signal (a data signal) to the data line DL.

Though FIG. 4 illustrates that the data driving circuit 240 is disposed in the circuit board PCB, the present disclosure is not limited thereto. In another embodiment, the data driving circuit 240 may be directly disposed on the substrate 100. For example, the data driving circuit 240 including a driver integrated circuit (IC) may be disposed in a region corresponding to the pad unit 230 of FIG. 4.

The first power voltage supply line 250 may be disposed in a pull-off area POA of the peripheral area PA. The pull-off area POA is between the display area DA and the pad unit 230. The first power voltage supply line 250 may include a first main line 251 extending along the first lateral side E1 of the display area DA, and a first connection line 252 connecting the first main line 251 to the pad unit 230.

The second power voltage supply line 260 may be disposed in the peripheral area PA to partially surround the display area DA. For example, the second power voltage supply line 260 may include a second main line 261 partially surrounding the display area DA, and a second connection line 262 connecting the second main line 261 to the pad unit 230.

The second main line 261 may have a loop shape where one side is open to partially surround the display area DA in FIG. 4. For example, a first portion 261a of the second main line 261 may correspond to a left side and a right side of the first lateral side E1 of the display area DA, and a second portion 261b of the second main line 261 may extend along the second, third, and fourth lateral sides E2, E3, and E4 of the display area DA while being connected with the first portion 261a. The second main line 261 may surround the vicinity of two opposite ends of the first power voltage supply line 250 in plan view.

The second connection line 262 may extend from two opposite ends of the second main line 261 toward the pad unit 230. The second connection line 262 may extend in parallel to the first connection line 252 in the pull-off area POA.

The first power voltage supply line 250 provides the first power voltage ELVDD (see FIGS. 5A and 5B) to each pixel P, and the second power voltage supply line 260 provides a second power voltage ELVSS (see FIGS. 5A and 5B) to each pixel P. The first power voltage ELVDD may be provided to respective pixels P through driving voltage lines PL connected to the first power voltage supply line 250. The second power voltage ELVSS may be provided to an opposite electrode (e.g. a cathode) of the organic light-emitting diode OLED. To transfer the second power voltage ELVSS, the second main line 261 of the second power voltage supply line 260 may be connected to the opposite electrode of the organic light-emitting diode OLED in the peripheral area PA.

Figure 6A:
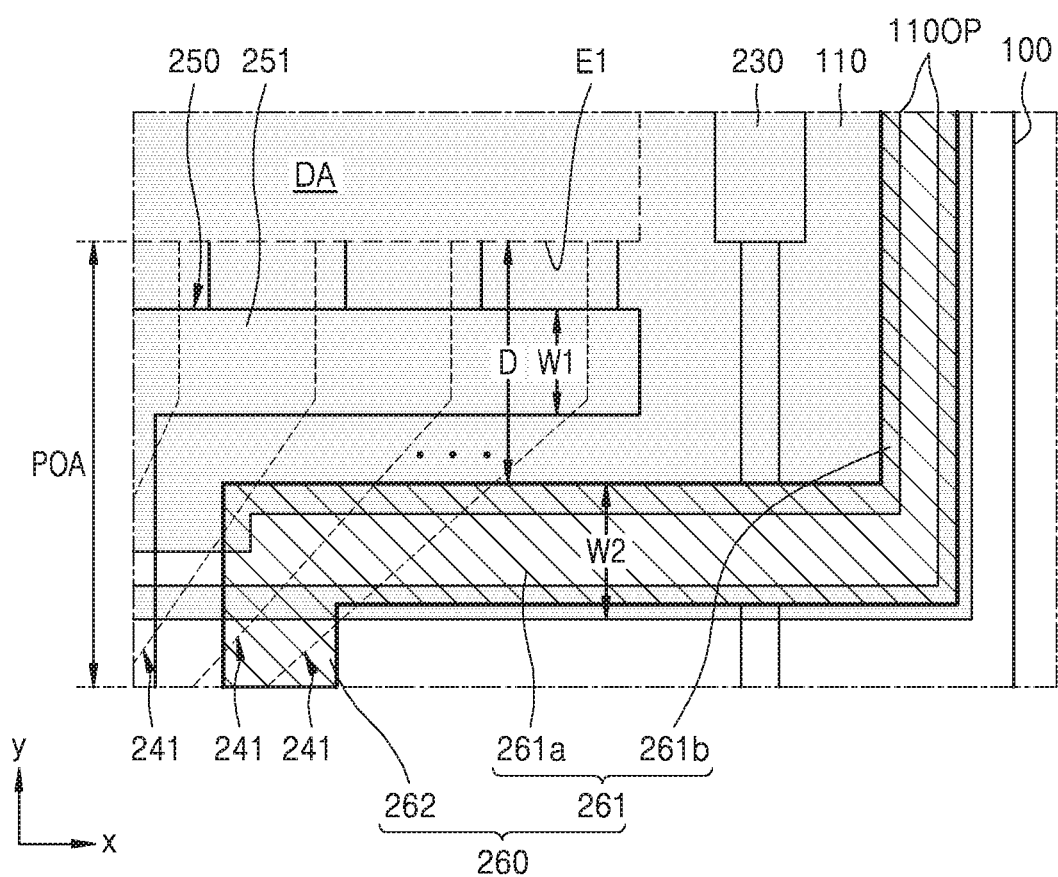
FIG. 6A is a plan view of a region VIa of FIG. 4.
Figure 6B:
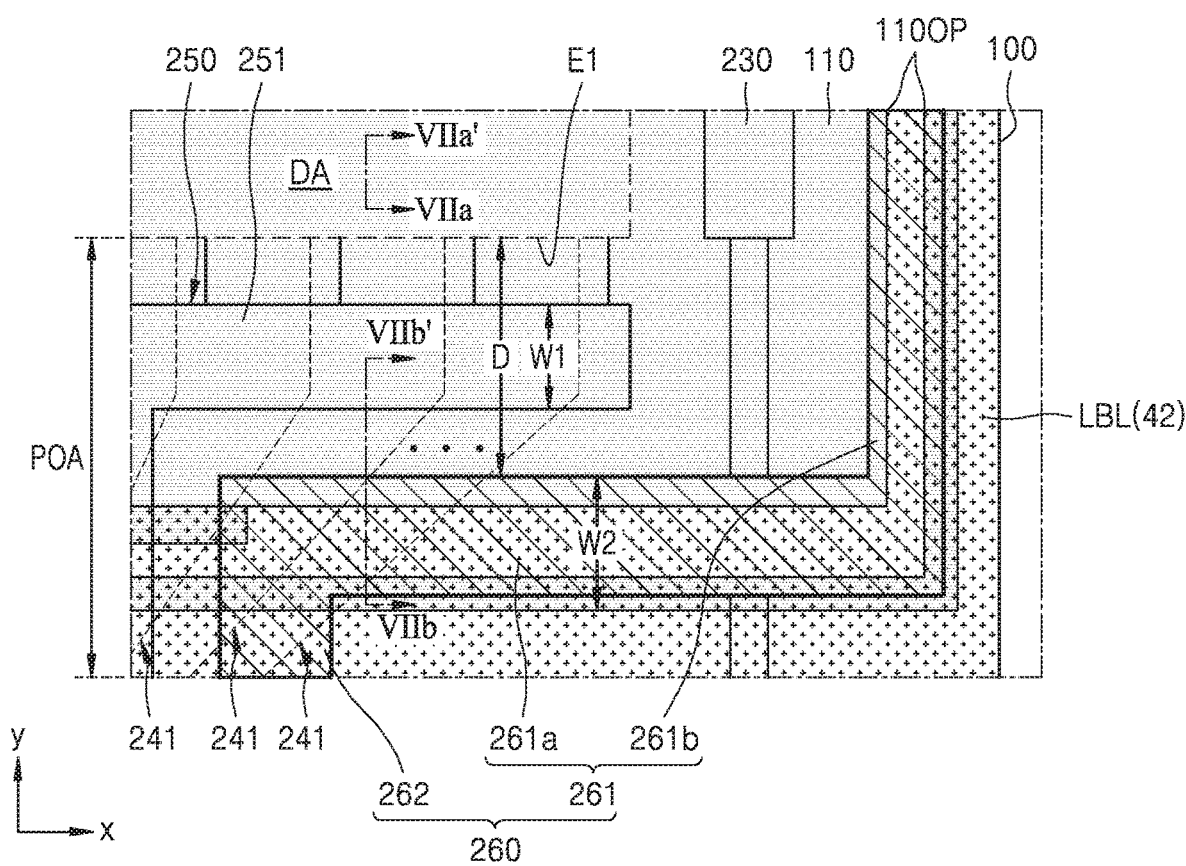
FIG. 6B is a plan view of a window arranged on a display panel of FIG. 6A.

FIG. 6A is a plan view of a region VIa of FIG. 4. FIG. 6B is a plan view of a window disposed on a display panel of FIG. 6A.

Referring to FIG. 6A, the first main line 251 of the first power voltage supply line 250 extends along the first lateral side E1 of the display area DA in the pull-off area POA. The first portion 261a of the second main line 261 of the second power voltage supply line 260 extends along the first lateral side E1 of the display area DA. The first portion 261a of the second main line 261 may be spaced apart by a predetermined distance D from the display area DA such that a portion of the first main line 251 is disposed between the display area DA and the first portion 261a of the second main line 261. A width W1 of the first main line 251 disposed between the display area DA and the first portion 261a of the second main line 261 may be less than a width W2 of the first portion 261a of the second main line 261.

The first and second power supply voltage lines 250 and 260 may be covered by an insulating layer 110. A portion of the second power voltage supply line 260 may be exposed through an opening 110OP in the insulating layer 110. The opening 110OP may be formed to pass through the insulating layer 110. A portion of the second power voltage supply line 260 may be overlapped by the opening 110OP in the insulating layer 110. The portion of the second power voltage supply line 260 exposed through and to which the opening 110OP extends may be electrically connected to the opposite electrode of the organic light-emitting diode OLED.

As illustrated in FIG. 6B, the opening 110OP of the insulating layer 110 is entirely covered by the light-blocking region 42, for example, the light-blocking pattern layer LBL of the window 40.

Figure 7:
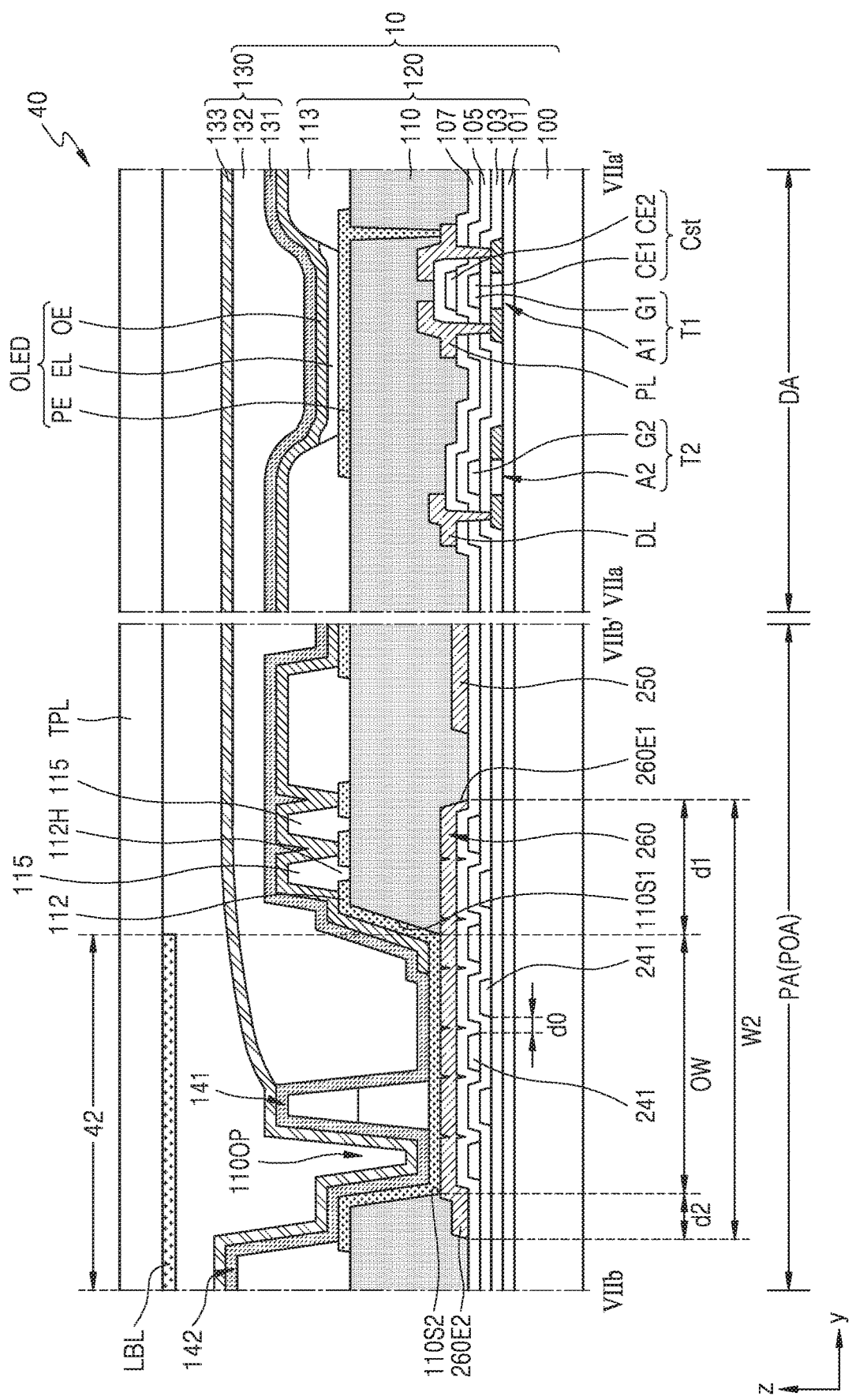
FIG. 7 is a cross-sectional view of a display device according to an embodiment.
Figure 8:
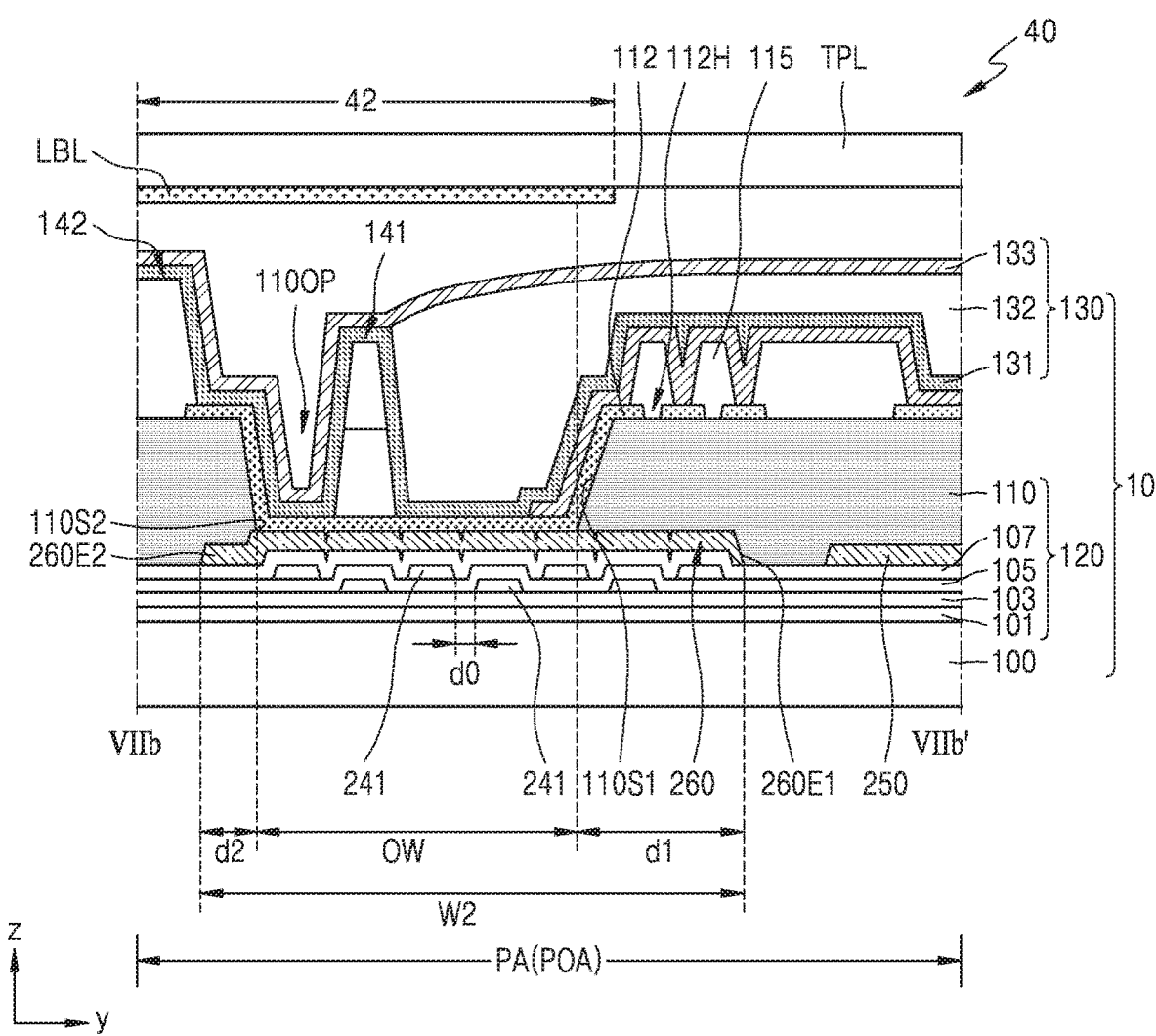
FIG. 8 is a cross-sectional view of a display device according to another embodiment.

FIG. 7 is a cross-sectional view of a display device according to an embodiment, taken along lines VIIa-VIIa' and VIIb-VIIb' of FIG. 6B. FIG. 8 is a cross-sectional view of a pull-off area of a display device according to another embodiment. For convenience of description, FIGS. 7 and 8 illustrate only the display panel 10 and the window 40 of the display device.

First, the display area DA is described with reference to a portion VIIa-VIIa' of FIG. 7.

A buffer layer 101 is disposed on the substrate 100. The buffer layer 101 may prevent penetration of foreign substances or moisture through the substrate 100. For example, the buffer layer 101 may include an inorganic material such as SiOx, SiNx and/or SiON, and may include a single layer or a multi-layer.

The first and second thin film transistors T1 and T2, the storage capacitor Cst, and the organic light-emitting diode OLED, which is a display element, are disposed over the substrate 100.

The first and second thin film transistors T1 and T2 respectively include first and second semiconductor layers A1 and A2, and first and second gate electrodes G1 and G2. The first and second semiconductor layers A1 and A2 may include, for example, polycrystalline silicon. Each of the first and second semiconductor layers A1 and A2 includes a channel region overlapping the first gate electrode G1 or the second gate electrode G2, a source region and a drain region respectively disposed in two opposite sides of the channel region and including high concentration impurities. Here, the impurities may include N-type impurities or P-type impurities. In another embodiment, the first and second semiconductor layers A1 and A2 may include amorphous silicon or an organic semiconductor material.

A gate insulating layer 103 may be disposed between the first and second semiconductor layers A1 and A2 and the first and second gate electrodes G1 and G2. The gate insulating layer 103 may be an inorganic material layer such as silicon oxynitride, silicon oxide, and/or silicon nitride, and the inorganic material layer may include a single layer or a multi-layer.

The storage capacitor Cst includes first and second storage capacitor plates CE1 and CE2 overlapping each other. A first interlayer insulating layer 105 may be disposed between the first and second storage capacitor plates CE1 and CE2. The first interlayer insulating layer 105 is a layer having a dielectric constant and may be an inorganic material layer such as silicon oxynitride, silicon oxide, and/or silicon nitride, and may include a single layer or a multi-layer.

Though FIG. 7 illustrates a case where the storage capacitor Cst overlaps the first thin film transistor T1, and the first storage capacitor plate CE1 serves as the first gate electrode G1, the present disclosure is not limited thereto. In another embodiment, the storage capacitor Cst may not overlap the first thin film transistor T1, and the first storage capacitor plate CE1 and the first gate electrode G1 may be separate independent elements.

The storage capacitor Cst may be covered by a second interlayer insulating layer 107. The second interlayer insulating layer 107 may be an inorganic material layer such as silicon oxynitride, silicon oxide, and/or silicon nitride, and may include a single layer or a multi-layer.

The driving voltage line PL and the data line DL may be disposed over the second interlayer insulating layer 107. The driving voltage line PL is connected to a source or drain region of the first thin film transistor T1. In some embodiments, the driving voltage line PL may be understood as a source or drain electrode of the first thin film transistor T1. The data line DL is connected to a source or drain region of the second thin film transistor T2. In some embodiments, the data line DL may be understood as a source or drain electrode of the second thin film transistor T2.

The driving voltage line PL and the data line DL may include Al, Cu, and Ti, and include a single layer or a multi-layer. In an embodiment, the driving voltage line PL and the data line DL may include a multi-layered structure of Ti/Al/Ti.

The insulating layer 110 may cover the driving voltage line PL and the data line DL. The insulating layer 110 is a planarization insulating layer having a flat top surface, may cover an irregular structure corresponding to the first and second thin film transistors T1 and T2, the storage capacitor Cst, the driving voltage line PL, and the data line DL thereunder, and include a flat top surface. The insulating layer 110 may include a general-purpose polymer such as an imide-based polymer, polymethylmethacrylate (PMMA) or polystyrene (PS), or polymer derivatives having a phenol-based group, an acryl-based polymer, an aryl ether-based polymer, an amide-based polymer, a fluorine-based polymer, a p-xylene-based polymer, a vinyl alcohol-based polymer, or a blend thereof. In an embodiment, the insulating layer 110 may include PI.

A pixel electrode PE is disposed on the insulating layer 110. A pixel-defining layer 113 is disposed on the pixel electrode PE. The pixel-defining layer 113 covers an edge of the pixel electrode PE and includes an opening extending to and exposing the pixel electrode PE. The opening of the pixel-defining layer 113 may be formed to pass through the pixel-defining layer 113. The opening of the pixel-defining layer 113 may overlap a portion of the pixel electrode PE. The pixel-defining layer 113 may include, for example, an organic material such as PI or hexamethyldisiloxane (HMDSO).

An emission layer EL may include a low molecular or polymer material. Functional layers may be disposed as a single layer or a composite layer between the pixel electrode PE and the emission layer EL and/or between the emission layer EL and an opposite electrode OE. The functional layers may include a hole injection layer (HIL), a hole transport layer (HTL), an emission layer (EML), an electron transport layer (ETL), and/or an electron injection layer (EIL).

The opposite electrode OE may face the pixel electrode PE with the emission layer EL therebetween and include one body to entirely cover the display area DA.

The encapsulation layer 130 may cover the organic light-emitting diode OLED, and prevent the organic light-emitting diode OLED from being damaged by external moisture or oxygen, etc. The encapsulation layer 130 may cover the display area DA and extend to the outside of the display area DA. The encapsulation layer 130 may include at least one inorganic encapsulation layer and at least one organic encapsulation layer. FIG. 7 illustrates a case where the encapsulation layer 130 includes a first inorganic encapsulation layer 131, an organic encapsulation layer 132, and a second inorganic encapsulation layer 133.

The first inorganic encapsulation layer 131 may cover the opposite electrode OE and include silicon oxide, silicon nitride, and/or silicon oxynitride. As needed, the first inorganic encapsulation layer 131 may include a plurality of layers having different qualities. Since the first inorganic encapsulation layer 131 is formed along a structure thereunder, a top surface of the first inorganic encapsulation layer 131 is not flat.

The organic encapsulation layer 132 may cover the first inorganic encapsulation layer 131. Unlike the first inorganic encapsulation layer 131, a top surface of the organic encapsulation layer 132 may be approximately flat. Specifically, a top surface of a portion of the organic encapsulation layer 132 corresponding to the display area DA may be approximately flat. The organic encapsulation layer 132 may include at least one of PET, PEN, PC, PI, polyethylene sulfonate, polyoxymethylene, PAR, and HMDSO.

The second inorganic encapsulation layer 133 may cover the organic encapsulation layer 132 and include silicon oxide, silicon nitride, and/or silicon oxynitride.

The encapsulation layer 130 may extend to the peripheral area PA. The organic encapsulation layer 132 of the encapsulation layer 130 may be formed by hardening a liquid organic material. To prevent the liquid organic material from entering an edge of the substrate 100 across the peripheral area PA, first and second dams 141 and 142 may be disposed in the peripheral area PA. The first and second dams 141 and 142 may be formed in the peripheral area PA to surround the display area DA. FIG. 7 illustrates that the first dam 141 is disposed over the second power voltage supply line 260, and the second dam 142 is disposed outside the first dam 141 and spaced apart from the first dam 141.

Next, the pull-off area POA of the peripheral area PA is described with reference to a portion VIIb-VIIb' of FIG. 7.

The wirings 241 are disposed in the pull-off area POA. The wirings 241 are wirings for transferring data signals as described above and may be alternately disposed with the first interlayer insulating layer 105 therebetween. For example, like a case where one of neighboring wirings 241 may be disposed under the first interlayer insulating layer 105, and another of the neighboring wirings 241 may be disposed on the first interlayer insulating layer 105, since the neighboring wirings 241 are respectively disposed in different layers, an interval d0 between the neighboring wirings 241 may be reduced.

The first and second power voltage supply lines 250 and 260 may be disposed on the second interlayer insulating layer 107. The first power voltage supply line 250 illustrated in FIG. 7 corresponds to the first main line 251 described with reference to FIG. 6A, and the second power voltage supply line 260 corresponds to the first portion 261a described with reference to FIG. 6A.

As illustrated in FIGS. 6A to 7, the first and second power voltage supply lines 250 and 260 may overlap the wirings 241 with the second interlayer insulating layer 107 therebetween. Since the first and second power voltage supply lines 250 and 260 overlap the wirings 241, a top surface of each of the first and second power voltage supply lines 250 and 260 may include an irregular surface corresponding to the wirings 241. The irregular surface denotes a surface having a valley at a location corresponding to a portion between the neighboring wirings 241, not a simple concave and convex surface. In relation to the valley, FIG. 7 illustrates a V-shaped valley. The first and second power voltage supply lines 250 and 260 may include the same material as that of the data line DL and/or the driving voltage line PL, and may be formed during the same process as that of the data line DL and/or the driving voltage line PL.

The first and second power voltage supply lines 250 and 260 may be covered by the insulating layer 110. For connection between the second power voltage supply line 260 and the opposite electrode OE of the organic light-emitting diode OLED, the insulating layer 110 includes the opening 110OP extending to and exposing the second power voltage supply line 260. As described above, a portion of the second power voltage supply line 260 exposed through the opening 110OP corresponds to the first portion 261a of the second main line 261 described with reference to FIG. 6A. A width OW of the opening 110OP is less than a width of the second power voltage supply line 260, for example, the width W2 of the first portion 261a. The opening 110OP is defined by a first lateral surface 110S1 and a second lateral surface 110S2 of the insulating layer 110. The width OW of the opening 110OP corresponds to a shortest distance among a distance between the first lateral surface 110S1 and the second lateral surface 110S2 of the insulating layer 110. That is, the width OW of the opening 110OP corresponds to a distance between a lower part of the first lateral surface 110S1 and a lower part of the second lateral surface 110S2.

The second power voltage supply line 260 may be electrically connected to the opposite electrode OE of the organic light-emitting diode OLED through the opening 110OP of the insulating layer 110. For example, since a connection electrode layer 112 on the insulating layer 110 contacts the second power voltage supply line 260 through the opening 110OP, and the connection electrode layer 112 contacts the opposite electrode OE of the organic light-emitting diode OLED, the second power voltage supply line 260 may be electrically connected to the opposite electrode OE of the organic light-emitting diode OLED. FIG. 7 illustrates that the connection electrode layer 112 disposed on the insulating layer 110 entirely contacts the second power voltage supply line 260 exposed through the opening 110OP across the first lateral surface 110S1 and extends on the second lateral surface 110S2. The connection electrode layer 112 may include the same material as that of the pixel electrode PE.

The opening 110OP is entirely covered by the light-blocking region 42 of the window 40. In an embodiment, when viewed in a direction perpendicular to the substrate 100, an inner edge of the light-blocking pattern layer LBL is disposed on the same line as that of an inner edge of the opening 110OP as illustrated in FIG. 7, or an inner edge of the light-blocking pattern layer LBL further extends toward the display area across the inner edge of the opening 110OP as illustrated in FIG. 8. Thus, the opening 110OP may be entirely covered by the light-blocking region 42, for example, the light-blocking pattern layer LBL of the window 40, and may overlap the light-blocking pattern layer LBL of the window 40. Since the opening 110OP is covered by the light-blocking pattern layer LBL, external light incident to the display panel 10 may be prevented from being reflected by a metal layer (e.g. the connection electrode layer 112, etc.) exposed through the opening 110OP and being viewed again by a user.

The light-blocking pattern layer LBL defining the light-blocking region 42 of the window 40 may be spaced apart from an edge of the display area DA by a predetermined interval by taking into account an alignment margin which may occur during a manufacturing process of the display device. Even when the light-blocking pattern layer LBL is spaced apart from the edge of the display area DA by the alignment margin, since the insulating layer 110 covers the first power voltage supply line 250, there is no possibility that external light is reflected by the first power voltage supply line 250 and viewed by a user. However, as a comparative example, in the case where the light-blocking pattern layer LBL covers only a portion of the opening 110OP, since external light incident from the outside is reflected by the metal layer exposed through the opening 110OP, the reflected light may be viewed by a user. Such external light reflection issue may still remain even when the polarizer, etc. is provided as the reflection prevention member described with reference to FIG. 2A, etc. Since a top surface of the second power voltage supply line 260 includes an irregular surface due to the wirings 241 under the second power voltage supply line 260 and thus external light is irregularly reflected by the irregular surface, even when the reflection prevention member is disposed, there is limit in preventing the external light reflection issue. Meanwhile, the external light reflection issue may be noticeable even more when a distance D (see FIG. 6A) between the display area DA and the second power voltage supply line 260 is reduced as an area of the peripheral area PA is reduced to increase a ratio of an area occupied by the display area DA. However, according to an embodiment, since the light-blocking pattern layer LBL entirely covers the opening 110OP, the occurrence of the external light reflection issue may be effectively prevented.

Two opposite edges of the second power voltage supply line 260, for example, first and second edges 260E1 and 260E2, may be disposed on two opposite sides with respect to one region of the second power voltage supply line 260 exposed through the opening 110OP. The first and second edges 260E1 and 260E2 are covered by the insulating layer 110. In this case, a peripheral portion of the first edge 260E1 adjacent to the display area DA may be more covered by the insulating layer 110 than a peripheral portion of the second edge 260E2. Regarding this, FIG. 7 illustrates that a first distance d1 from the first edge 260E1 of the second power voltage supply line 260 to the opening 110OP is greater than a second distance d2 from the second edge 260E2 of the second power voltage supply line 260 to the opening 110OP. Since the peripheral portion of the first edge 260E1 of the second power voltage supply line 260 adjacent to the display area DA is more covered by the insulating layer 110, a contact area between the second power voltage supply line 260 and the connection electrode layer 112 may be sufficiently secured and the external light reflection issue may be prevented without increasing a width of the light-blocking region 42.

The connection electrode layer 112 disposed on the insulating layer 110 covering the first edge 260E1 of the second power voltage supply line 260 and the peripheral portion thereof may include a plurality of holes 112H. At least one of the holes 112H may overlap the second power voltage supply line 260.

Since the insulating layer 110 under the connection electrode layer 112 is a planarization layer and includes an organic material, the insulating layer 110 may have an approximately flat top shape even though the second power voltage supply line 260 having the irregular surface is present thereunder. Since the insulating layer 110 includes the organic material, a gas may occur from the insulating layer 110 during a manufacturing process of the display panel or after the display panel is manufactured. When the occurring gas is not discharged to the outside, the insulating layer 110 may swell up and a defect in a conductive layer or wirings (e.g. the second power voltage supply line 260 and the connection electrode layer 112) over/below the insulating layer 110 may occur. Therefore, a portion of the connection electrode layer 112 which is disposed on the top surface of the insulating layer 110 may have the hole 112H, and the hole 112H which is an out-gassing path may overlap the second power voltage supply line 260. The edge of the hole 112H may be covered by an insulating pattern layer 115 to prevent the connection electrode layer 112 from being damaged during a process described below. The insulating pattern layer 115 may be an organic insulating layer including the same material as that of the pixel-defining layer 113. The insulating pattern layer 115 covers the hole 112H and exposes a portion of the connection electrode layer 112 in which the hole 112H is not formed. The portion of the connection electrode layer 112 exposed by the insulating pattern layer 115 may contact the opposite electrode OE.

Figure 9:
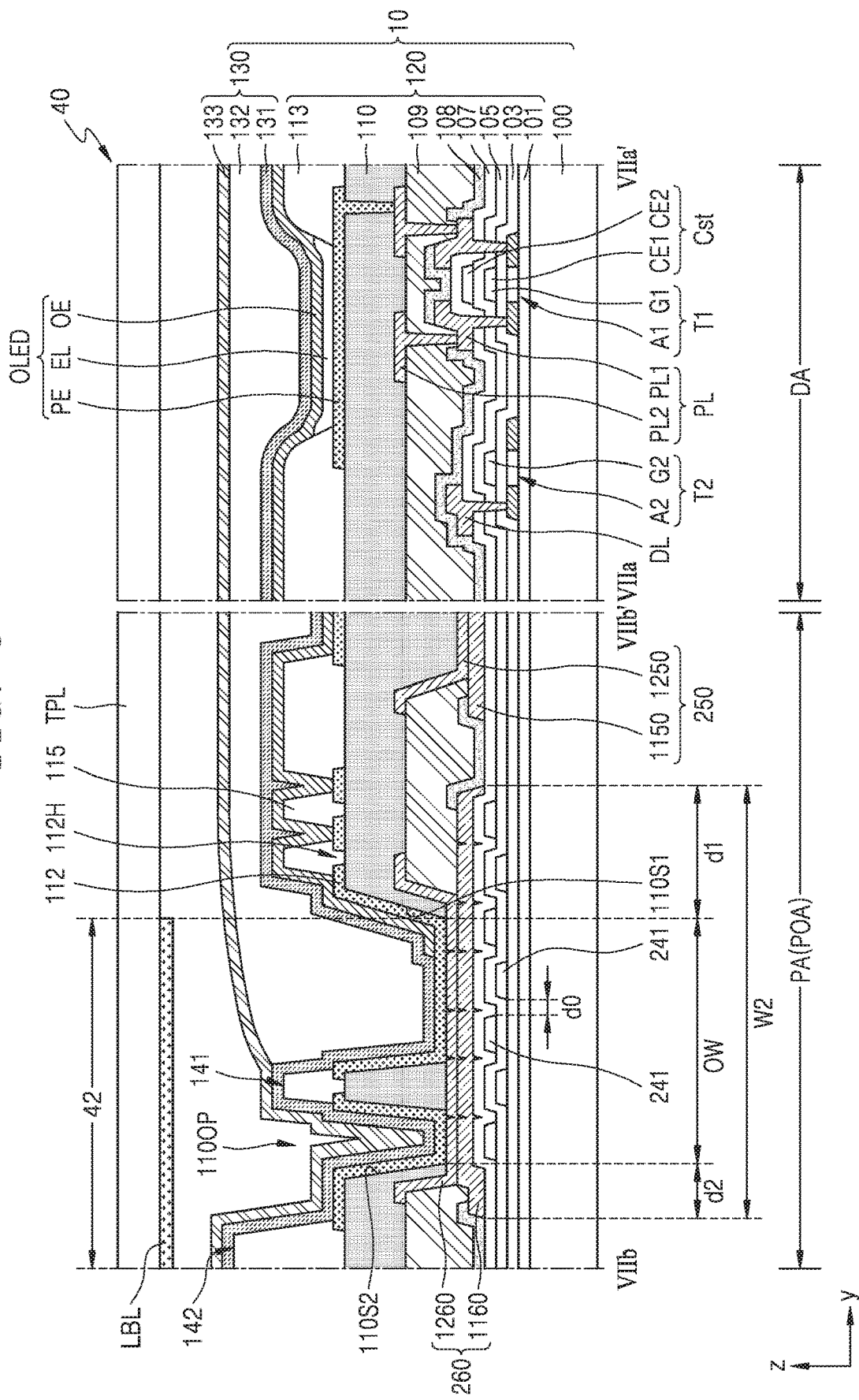
FIG. 9 is a cross-sectional view of a display device according to another embodiment.

FIG. 9 is a cross-sectional view of a display device according to another embodiment. For convenience of description, FIG. 9 illustrates only the display panel 10 and the window 40, and descriptions of the same configurations are omitted (see contents described with reference to FIG. 7). Differences are mainly described below.

Referring to the display area DA of FIG. 9, the driving voltage line PL may include a lower driving voltage line layer PL1 and an upper driving voltage line layer PL2 connected through a contact hole of a second insulating layer 109. The second insulating layer 109 may include an organic insulating material. The organic insulating material may include a general-purpose polymer such as an imide-based polymer, PMMA or PS, or polymer derivatives having a phenol-based group, an acryl-based polymer, an aryl ether-based polymer, an amide-based polymer, a fluorine-based polymer, a p-xylene-based polymer, a vinyl alcohol-based polymer, or a blend thereof. The lower and upper driving voltage line layers PL1 and PL2 may include Al, Cu, Ti, etc., and may include a single layer or a multi-layer.

Since the driving voltage line PL may reduce a resistance of the driving voltage line PL itself by including the lower and upper driving voltage line layers PL1 and PL2, a voltage drop by the resistance of the driving voltage line PL may be prevented and a high-quality image may be provided. In an embodiment, the lower driving voltage line layer PL1 may be covered by an inorganic insulating layer 108. Though FIG. 9 illustrates that the lower driving voltage line layer PL1 includes the same material as that of the data line DL and is disposed on the same layer (e.g. the second interlayer insulating layer 107), the embodiment is not limited thereto. In another embodiment, the data line DL may include the same material as that of the upper driving voltage line layer PL2 and may be disposed on the same layer (e.g. the second insulating layer 109).

The peripheral area PA, for example, the pull-off area POA of FIG. 9, is described.

The first and second power voltage supply lines 250 and 260 may include a plurality of conductive layers contacting each other with an insulating layer therebetween. The first power voltage supply line 250 may include a lower first power voltage supply line layer 1150 under the second insulating layer 109, and an upper first power voltage supply line layer 1250 on the second insulating layer 109. The lower and upper first power voltage supply line layers 1150 and 1250 may contact each other through a contact hole defined in and extending through the second insulating layer 109. Likewise, the second power voltage supply line 260 may include a lower second power voltage supply line layer 1160 under the second insulating layer 109, and an upper second power voltage supply line layer 1260 on the second insulating layer 109. The lower and upper second power voltage supply line layers 1160 and 1260 may contact each other through a contact hole defined in and extending through the second insulating layer 109. The first power voltage supply line 250 illustrated in FIG. 9 corresponds to the first main line 251 described with reference to FIG. 6A, and the second power voltage supply line 260 corresponds to the first portion 261a described with reference to FIG. 6A. Edges of the lower first power voltage supply line layer 1150 and the lower second power voltage supply line layer 1160 may be covered by the inorganic insulating layer 108.

The insulating layer 110 is disposed on the second power voltage supply line 260 and includes the opening 110OP exposing a portion of the second power voltage supply line 260. The insulating layer 110 may cover all of two opposite edges of the second power voltage supply line 260, for example, two opposite edges of the lower and upper second power voltage supply line layers 1160 and 1260. Regarding this, FIG. 9 illustrates that widths of the lower and upper second power voltage supply line layers 1160 and 1260 are greater than the width OW of the opening 110OP.

The width OW of the opening 110OP is less than the width W2 of the second power voltage supply line 260. The width W2 of the second power voltage supply line 260 including the two conductive layers may be understood as a length between the two opposite edges when viewed from a direction perpendicular to the substrate 100, that is, when projected from the direction perpendicular to the substrate 100.

A portion of the second power voltage supply line 260 exposed through the opening 110OP is electrically connected to the opposite electrode OE of the organic light-emitting diode OLED through the connection electrode layer 112. The light-blocking region 42, for example, the light-blocking pattern layer LBL of the window 40 prevents the external light reflection issue by entirely covering the opening 110OP as described with reference to FIG. 7. In another embodiment, the light-blocking pattern layer LBL entirely covers the opening 110OP and the inner edge of the light-blocking pattern layer LBL may further extend toward the display area DA across the inner edge of the opening 110OP as illustrated in FIG. 8.

Although the disclosure has been described with reference to the embodiments illustrated in the drawings, this is merely provided as an example and it will be understood by those of ordinary skill in the art that various changes in form and details and equivalents thereof may be made therein without departing from the spirit and scope of the disclosure as defined by the following claims.

What is claimed is:

1. A display device comprising:
   a substrate comprising a display area and a peripheral area outside the display area;
   a plurality of pixels in the display area;
   a plurality of wirings in the peripheral area;
   a power voltage supply line covering the plurality of wirings and including a top surface having an irregular surface corresponding to the plurality of wirings;
   an insulating layer including an opening overlapping a first portion of the power voltage supply line; and
   a window disposed on the insulating layer and including a light-blocking region and a light-transmissive region, the light-blocking region entirely covering the opening.

2. The display device of claim 1, wherein neighboring wirings among the plurality of wirings are alternately arranged with an interlayer insulating layer therebetween.

3. The display device of claim 1, wherein the power voltage supply line comprises a first edge adjacent to the display area, and a second edge opposite to the first edge, the first and second edges being covered by the insulating layer.

4. The display device of claim 3, wherein a width of the power voltage supply line is greater than a width of the opening.

5. The display device of claim 3, wherein a first distance from the first edge to the opening is greater than a second distance from the second edge to the opening.

6. The display device of claim 1, wherein the insulating layer comprises an organic insulating material.

7. The display device of claim 1, wherein each pixel of the plurality of pixels comprises:
   a pixel electrode and an opposite electrode facing each other; and an emission layer between the pixel electrode and the opposite electrode.

8. The display device of claim 7, further comprising a connection electrode layer connecting the power voltage supply line with the opposite electrode.

9. The display device of claim 8, wherein the connection electrode layer is disposed on the insulating layer and contacts the power voltage supply line through the opening.

10. The display device of claim 9, wherein the connection electrode layer comprises a hole.

11. The display device of claim 10, wherein the hole of the connection electrode layer overlaps the power voltage supply line with the insulating layer therebetween.

12. The display device of claim 10, further comprising an insulating pattern layer covering the hole and exposing the connection electrode layer.

13. The display device of claim 12, wherein the insulating pattern layer comprises an organic insulating layer.

14. The display device of claim 11, wherein an inner edge of the light-blocking region is spaced apart from an edge of the display area.

15. A display device comprising:
a substrate comprising a display area and a peripheral area outside the display area;
a plurality of pixels in the display area;
a first power voltage supply line in the peripheral area and adjacent to one side of the display area;
a second power voltage supply line disposed in the peripheral area and including a first portion spaced apart from the one side of the display area, the first power voltage supply line being disposed between the one side of the display area and the first portion;
a planarization insulating layer disposed on the first power voltage supply line and the second power voltage supply line, and including an opening overlapping the first portion of the second power voltage supply line; and
a light-blocking pattern layer disposed on the planarization insulating layer and entirely covering the opening.

16. The display device of claim 15, further comprising a plurality of wirings disposed between the substrate and the second power voltage supply line.

17. The display device of claim 16, wherein neighboring wirings among the plurality of wirings are alternately arranged with an interlayer insulating layer therebetween.

18. The display device of claim 15, wherein the second power voltage supply line comprises a first edge adjacent to the one side of the display area and a second edge opposite to the first edge, and the opening corresponds to a region between the first edge and the second edge.

19. The display device of claim 18, wherein a width of the second power voltage supply line directed from the first edge to the second edge is greater than a width of the opening.

20. The display device of claim 18, wherein a first distance from the first edge to the opening is greater than a second distance from the second edge to the opening.

21. The display device of claim 15, wherein each pixel of the plurality of pixels comprises:
a pixel electrode and an opposite electrode facing each other; and
an emission layer between the pixel electrode and the opposite electrode.

22. The display device of claim 21, wherein the second power voltage supply line is electrically connected to the opposite electrode.

23. The display device of claim 22, further comprising a connection electrode layer disposed on the planarization insulating layer and connecting the opposite electrode with the second power voltage supply line.

24. The display device of claim 23, wherein the connection electrode layer comprises a hole.

25. The display device of claim 24, wherein the hole overlaps the second power voltage supply line.

26. The display device of claim 24, further comprising an insulating pattern layer covering the hole.

27. The display device of claim 26, wherein the insulating pattern layer exposes the connection electrode layer.

28. The display device of claim 15, wherein an inner edge of the light-blocking pattern layer is spaced apart from the one side of the display area by a predetermined interval.

* * * * *